(12) United States Patent
Hunger et al.

(10) Patent No.: US 7,180,283 B2
(45) Date of Patent: Feb. 20, 2007

(54) WAFER LIFTING DEVICE

(75) Inventors: Rudiger Hunger, Dresden (DE); Steffen Herberg, Kesselsdorf (DE); Falk Bednara, Dersden (DE)

(73) Assignee: Infineon Technologies, AG, Munich (DE)

( * ) Notice: Subject to any disclaimer, the term of this patent is extended or adjusted under 35 U.S.C. 154(b) by 309 days.

(21) Appl. No.: 10/622,050

(22) Filed: Jul. 17, 2003

(65) Prior Publication Data
US 2004/0051220 A1    Mar. 18, 2004

(30) Foreign Application Priority Data
Jul. 17, 2002 (DE) .................. 102 32 478

(51) Int. Cl.
*G01R 31/28* (2006.01)
*H01L 21/00* (2006.01)
(52) U.S. Cl. ..................... 324/158.1; 438/800
(58) Field of Classification Search ............ 324/754, 324/756, 758, 765, 158.1; 438/800; 361/233–234, 361/160, 115; 269/13; 219/443, 405, 311, 219/497; 118/724–725; 414/935
See application file for complete search history.

(56) References Cited
U.S. PATENT DOCUMENTS 5,669,977 A    9/1997 Shufflebotham et al. .... 118/728
5,848,670 A    12/1998 Salzman .................. 187/272
6,572,708 B2 *  6/2003 Gujer et al. ................ 118/728
6,646,857 B2 * 11/2003 Anderson et al. .......... 361/234

FOREIGN PATENT DOCUMENTS

| DE | 274708 | | 12/1989 |
| JP | 05-129421 | * | 5/1993 |
| JP | 05129421 | | 5/1993 |
| JP | 0700702 | | 1/1995 |
| JP | 07007072 A | | 1/1995 |

\* cited by examiner

*Primary Examiner*—Ha Tran Nguyen
*Assistant Examiner*—Tung X. Nguyen
(74) *Attorney, Agent, or Firm*—Baker Botts L.L.P.

(57) ABSTRACT

The invention, which relates to a wafer lifting device having a lifting platform arranged under a wafer receptacle, which lifting platform can be moved in the vertical direction and at least three pins which can be moved in through holes in the wafer receptacle. The pins are separately guided in the through holes. A pin is guided and held such that it can be moved longitudinally, and the pin guide is fixedly connected to the wafer receptacle.

17 Claims, 3 Drawing Sheets

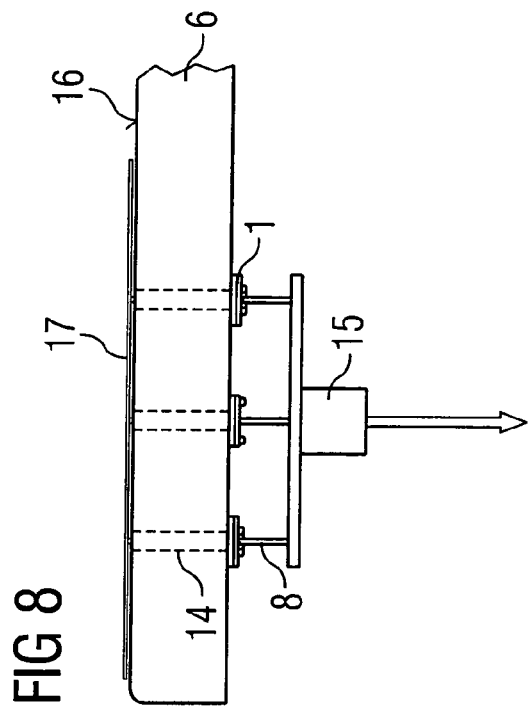
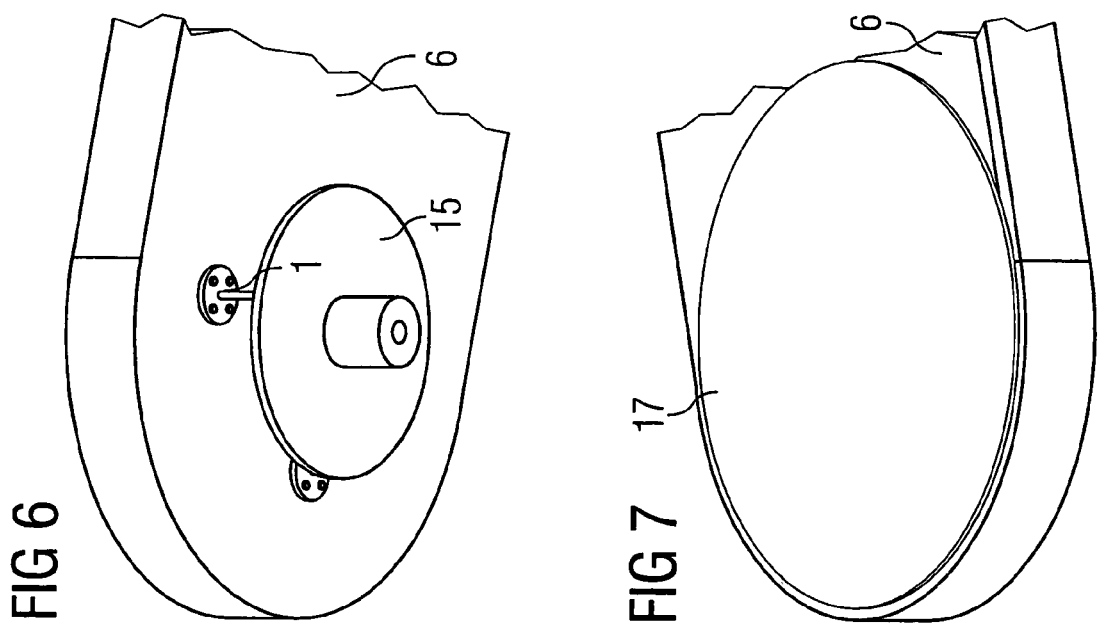

WAFER LIFTING DEVICE

BACKGROUND OF THE INVENTION

The invention relates to a wafer lifting device having a lifting platform arranged under a wafer support member, the top side of which forms a wafer bearing area, wherein the lifting platform can be moved toward and away from the underside of the wafer support member, in a vertical direction. At least three pins extending in the vertical direction are arranged to move in through holes in the wafer support member, which run from the underside of the wafer support member to the wafer bearing area on the top side thereof. With the lifting platform raised, in a first upper position near the underside of the wafer support member, the pins project from the wafer bearing area by a selected amount. With the lifting platform lowered, in a second lower position remote from the underside of the wafer support member, the pins are retracted into the support member.

It is known that, for fabricating semiconductor components with a wide variety of functions, chips are subjected to a plurality of process steps in which the semiconductor material undergoes various physical-chemical treatments.

During some of these process steps and also during the testing of chips in the wafer composite, the wafers are placed on wafer support members and treated in a horizontal position. There are provided handling systems which take up the wafers, position them over the wafer support member and deposit them on the wafer support member by means of a vertical relative movement between wafer support member and handling system.

The wafer support member may be designed as a heating plate. In particular, such heating plates are used during the process step of resist incineration. During this process step, the wafers are heated by means of the heating plate, and the hot wafers are exposed to an oxygen atmosphere. As a result, the photoresist of a photoresist mask which is situated on the wafer oxidizes to form a volatile gas and burns without any residue.

Such wafer support members designed as heating plates are provided with a wafer lifting device. The wafer lifting device comprises a lifting platform arranged under the heating plate, which lifting platform can be moved vertically by means of a pneumatic cylinder, whereas the wafer support member is fixed. Three vertical pins which project into holes in the heating plate are fastened on the lifting platform. The holes are designed as through holes and accordingly extend from the underside of the heating plate as far as its top side, serving as wafer bearing area. The pins have a length such that they project from the wafer bearing area by a selected amount with the lifting platform raised. With the lifting platform lowered, the pins are sunk in the holes. During a lifting movement of the lifting platform, the pins are guided in the through holes.

If a wafer is then to be deposited onto the heating plate, firstly the lifting platform is moved into its upper position, the pins projecting from the wafer bearing area. By means of a handling device having a supporting fork, on which the wafer is carried, the wafer is brought over the heating plate and moved downward. In this case, the wafer is deposited on the pins and the supporting fork is relieved of the burden of the wafer and can then be retracted from the space between wafer underside and wafer bearing area. The lifting platform is subsequently lowered until the top ends of the pins lie in the through holes. As a result, the wafer is deposited on wafer bearing area.

If the wafer is to be removed again after the corresponding process step, the procedure is reversed.

Since the pins become heated during processing of a wafer, when the wafer is placed onto the pins, it is heated by the pins in point-type fashion. However, such point-type exposure of the wafer to heat is unfavorable for technological reasons. For this reason, the pins are provided with tips at their top side in order to minimize the heat dissipation.

Such a wafer lifting device has the disadvantage that the pins cannot be guaranteed to be guided entirely satisfactorily on account of the thermal expansion between the through holes. This has the effect that the pins may rub in the through holes, which leads firstly to an extremely undesirable generation of particles on account of a material removal in the through holes or at the pins, and secondly to a scratching of the wafers on the underside. In the case of scratching of the wafers, particles may then in turn be produced and, moreover, the risk of the wafer breaking may be increased.

Consequently, the invention is based on the object of configuring the guide of the pins in the through holes to avoid any disadvantageous effects for the process sequence.

SUMMARY OF THE INVENTION

According to the invention, the object is achieved in that a separate pin guide is provided for each pin, in which pin guide the pin is guided and held such that it can be moved longitudinally, and the pin guide is fixedly connected to the wafer support member. As a result of this, the pin is mechanically decoupled from the lifting platform in such a way that dimensional differences between the lifting platform and the wafer support member can no longer influence the movement of the pin. Thus, a grinding of the pin and the generation of particles and also a scratching of the wafer rear side are avoided. In particular, this is beneficial in the case of wafer support members embodied as a heating plate. The heating plate has a temperature which differs from the temperature of the lifting platform. Differences in the thermal expansions may lead to geometrical differences between heating plate and lifting platform support member, the disadvantages of which can be avoided in the manner explained above. Moreover, what has a favorable effect in this application is the fact that the connection of the pin guide to the wafer support member means that the pin guide and the pin assume approximately the same temperature, thereby improving guidance of the pin.

In a preferred wafer lifting device, the pin guide has a guide hole, in which the pin is arranged in movable fashion, and is arranged to hold the pin in its lower position with the lifting platform lowered. The guide hole is expediently introduced with a diameter corresponding to the diameter of the pin with a corresponding tolerance. The tolerance is intended to ensure that the pin is guided in smooth-running fashion without appreciable abrasion. This can be assisted through the choice of a suitable material paring of pin and body.

In the case where a wafer support member is designed as a heating plate, the tolerances have to be chosen in accordance with the hot heating plate. For this intended use, $Al_2O_3$ (ceramic), MARCOR and VESPEL SP-1 are suitable as materials for the arrangement according to the invention.

In one configuration of the invention, it is provided that the pin is spring-loaded in the direction of its lower position. As a result, the pin always adopts a defined position. When the lifting platform is raised, the spring force is then overcome and the pin is raised concomitantly.

One possibility for the configuration is that the pin guide is integrated in the wafer support member and the guide hole is formed by the through hole. Even such a simple arrangement, which can be realized with little outlay, results in the decoupling of pin and lift platform according to the invention.

Another possibility provides for the pin guide to have a cylindrical body connected to the wafer support member. The use of a separate pin guide means that the guide can be optimally configured through corresponding surface configuration of the guide areas and through suitable material parings. A separate pin guide also makes it possible to introduce friction-reducing sliding bearings.

In this case the pin guide may be located outside the wafer support member. However, it is also possible for the cylindrical body to be introduced into a mounting hole in the wafer support member, said mounting hole being coaxial with respect to the through hole.

Given a corresponding thickness of the wafer support member, the mounting hole may extend only over part of the thickness of the wafer support member. Consequently, it is possible, for example, to avoid the situation where the wafer bearing area is disturbed by an emergence of the cylindrical body. It is favorable in terms of production, by contrast, to introduce the cylindrical body into the wafer support member such that the cylindrical body has a length corresponding to the thickness of the wafer support member and the mounting hole is a through hole and has a diameter which is equal to or slightly greater than the diameter of the cylindrical body.

One possibility for the connection of the cylindrical body to the wafer support member is that the mounting hole has an internal thread and the cylindrical body has an external thread and engagement means for a screw tool and the cylindrical body is screwed into the support member hole. Thus, by way of example, the cylindrical body may be provided, at its underside, with a hexagon which projects from the underside of the wafer support member in the screwed-in state. A jaw or ring spanner can then be attached to this hexagon in order to unscrew the cylindrical body. The procedure is reversed in the course of assembly.

Another possibility for the connection of the cylindrical body to the wafer support member is that the cylindrical body, at a side perpendicular to the center axis of the guide hole, is provided with a flange having fastening holes corresponding to screw connections in the wafer support member This solution is favorable in particular when the wafer support member is configured as a heating plate, since here larger tolerances of the individual components are possible and, consequently, it is possible to avoid jamming on account of different thermal expansions.

In the variant with the flange plate, in one embodiment, the fastening holes lie opposite corresponding threaded holes in the wafer support member into which fastening screws can be screwed through the fastening holes.

In another embodiment, threaded bolts are introduced in the wafer support member, which threaded bolts pass through the fastening holes in the flange and can be screwed onto nuts.

The pin may be held by providing an enlarged bore having an upper and a lower end and having a larger cross section than the guide hole. The enlarged bore being coaxial with respect to the guide hole. In this case, the pin has an attachment, which is smaller than the cross section of the enlarged bore. The pin can be moved longitudinally in the enlarged bore together with the pin. The lower end of the enlarged bore is formed by a cover being applied on the flange plate. The cover has a pin hole, which has a smaller cross section than the enlarged bore and through which the pin passes. The cover thus forms a stop for the pin attachment, so that it is possible to prevent the pin from sliding out. The upward movement of the pin is limited by the lifting height of the lifting platform. Here it is necessary only to ensure that the enlarged bore has a height such that the pin can move over the complete lifting height and a stop of the attachment at the upper end before reaching the lifting height is avoided.

In a favorable configuration in terms of production, it is provided that the enlarged bore has a diameter which is greater than the diameter of the guide hole, and that the attachment is designed as a ring surrounding the pin.

In principle, it is possible for the pin to move downward as a result of gravitational force when the lifting platform is lowered. However, in order to increase the functional reliability, one embodiment provides for a helical spring surrounding the pin to be arranged in the enlarged bore. The helical spring is supported between the upper end of the enlarged bore and the attachment.

In the case where the wafer support member is configured as a heating plate, one configuration of the invention provides for the spring to be composed of a material having a spring durability of greater than 250° C., preferably up to 800° C. It can thus be ensured that the helical spring maintains its spring properties even in this case. INCONEL X750 has proved to be an expedient material here.

The invention will be explained in more detail below using an exemplary embodiment in which the wafer support member is embodied as a heating plate.

BRIEF DESCRIPTION OF THE DRAWINGS

FIG. 6 shows a perspective bottom view of a heating plate with lowered lifting platform.

FIG. 7 shows a perspective plan view of a heating plate with lowered lifting platform.

FIG. 8 shows a side view of a heating plate with a lowered heating platform.

DESCRIPTION OF THE INVENTION

Figure 1:
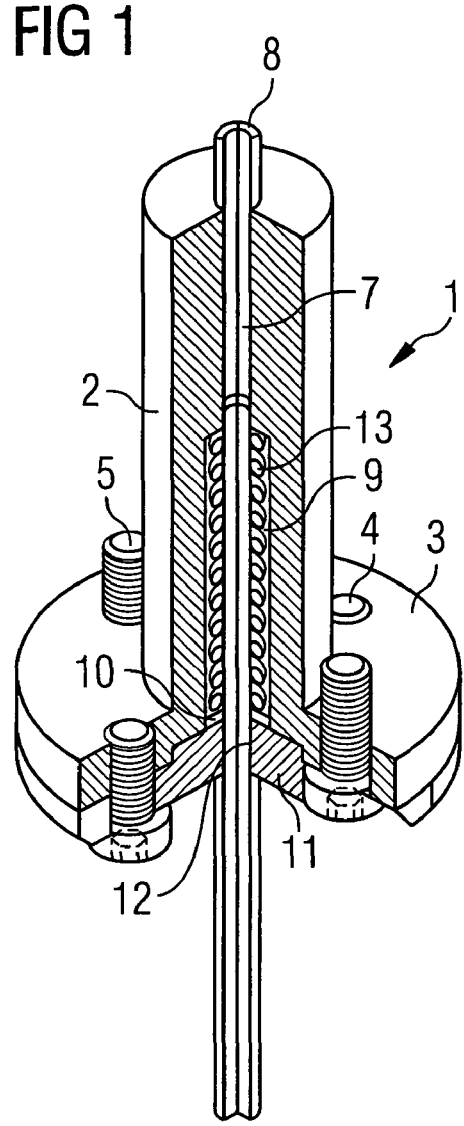
FIG. 1 shows a pin guide with a pin in the lower end position.
Figure 2:
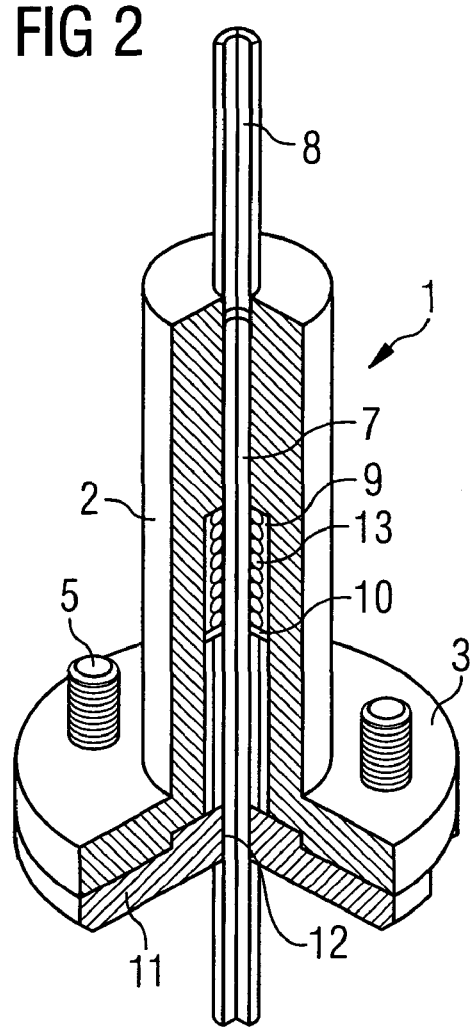
FIG. 2 shows a pin guide with a pin in the upper end position.

As illustrated in FIGS. 1 and 2, a pin guide 1 has a cylindrical body 2. The body 2 is provided with a flange plate 3 at its underside. The flange plate 3 is provided with fastening holes 4, through which fastening screws 5 can be screwed into threaded mounting holes in the wafer support member 6.

The cylindrical body 2 is provided with a guide hole 7, in which a pin 8 is arranged such that it can be moved longitudinally in smoothly running fashion. An enlarged bore 9 is formed in the body 2 coaxially with respect to the guide hole 7. In the enlarged bore 9, at the pin 8, an attachment 10 is arranged as a bead around the pin. At its lower end, the enlarged bore 9 is closed off with a cover 11, into which a pin guide hole 12 is formed coaxially with respect to guide hole 7 and enlarged bore 9, through which pin hole the pin 8 can be moved. The cover 11 forms the lower end of the enlarged bore 9.

A helical spring 13 surrounding the pin 8 is tensioned between the upper end of the enlarged bore 9 and the attachment 10, and presses the attachment 10 in the direction of cover 11 and thus the pin 8 downward, as is illustrated in FIG. 1. The position of the pin 8 pressed upward is illustrated in FIG. 2. It can be seen from this that the enlarged bore 9 must be introduced into the basic body 2 with a depth such that the full lifting height of the pin 8 is ensured and space still remains for the compressed helical spring 13.

The cover 11 has the same fastening holes 4 as the flange plate 3 and is fixedly screwed together with the latter.

Figure 5:
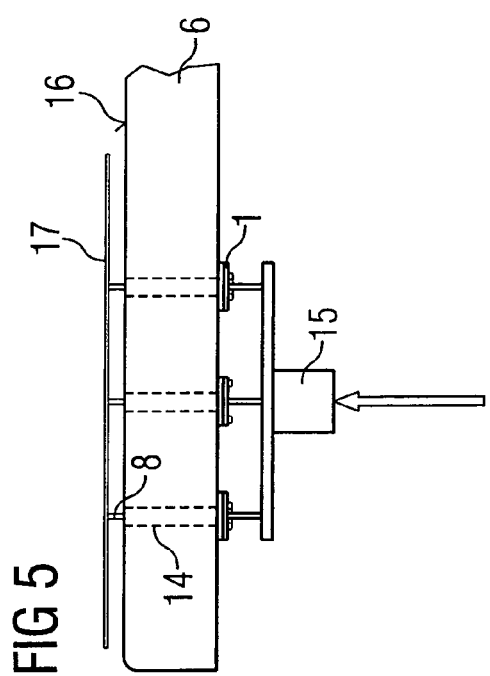
FIG. 5 shows a side view of a heating plate with raised lifting platform.
Figure 3:
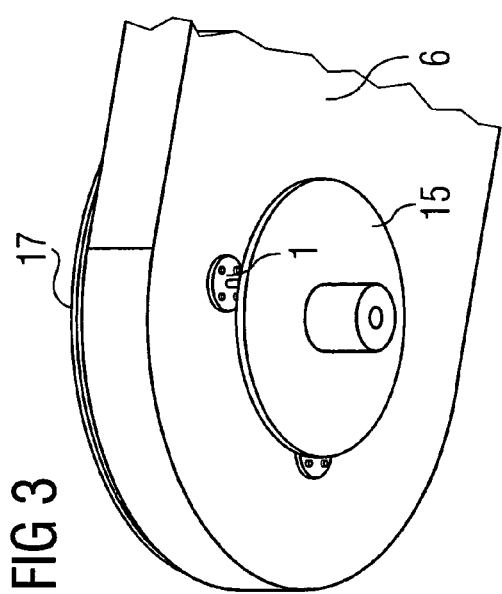
FIG. 3 shows a perspective bottom view of a heating plate with raised lifting platform.
Figure 4:
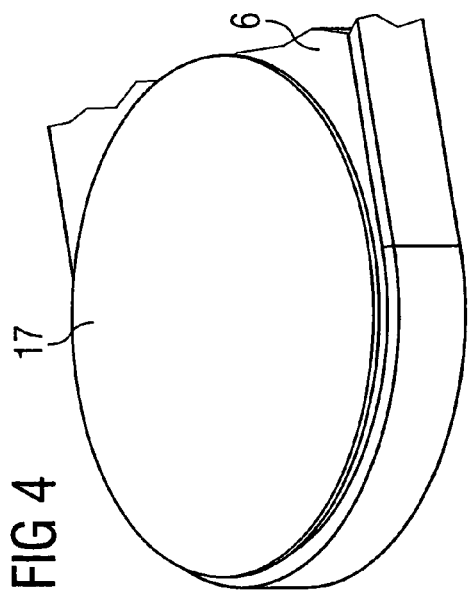
FIG. 4 shows a perspective plan view of a heating plate with raised lifting platform.

As illustrated in FIGS. 3, 5, 6 and 8, the cylindrical body 2 is inserted into mounting holes 14 in the wafer support member 6 and may be held by means of the fastening screws 5. The pins 8 are pressed upward by a lifting platform 15 during a lifting movement and then protrude from the wafer support member area 16. This is illustrated in FIGS. 3 to 5. In this position, a fork (not specifically illustrated) of a handling device deposits a wafer 17, which bears on it during transport, on the projecting pins 8. The fork can thus be pulled out from under the wafer 17.

As illustrated in FIGS. 6 to 8, the lifting platform 15 is then moved downward, the helical springs 13 likewise pressing the pins 8 downward. As a result, the pins 8 are sunk in the wafer support member 6 and the wafer 17 bears on the wafer support member area 16 of the wafer support member and is heated by the latter, as a result of which an activation energy required for a resist combustion process is introduced into the wafer 17.

In order to remove the wafer 17 after this process step, the lifting platform 15 is raised, as a result of which the pins 8 release the wafer 17 from the wafer support member area 16 and the fork can remove the wafer 17.

While there have been described what are believed to be the preferred embodiments of the invention, those skilled in the art will recognize that other and further changes and modifications may be made thereto without departing from the spirit of the invention, and it is intended to claim all such changes and modifications as fall within the true scope of the invention.

We claim:

1. A wafer lifting device comprising:
    a wafer support member:
    a lifting platform arranged under said a wafer support member; and
    at least three pins; and
    at least a pin guide body,
    wherein the top side of said wafer support member includes a wafer bearing area, wherein said lifting platform is arranged to move vertically toward and away from the underside of the wafer support member, and wherein said at least three pins are arranged to be moved through vertical-through holes, which extend from the underside of the wafer support member to the wafer bearing area, by said lifting platform, said pins being moveable between a first upper position wherein said pins project from the wafer bearing area by a selected amount and a second lower position wherein said pins are retracted into said vertical-through holes, wherein a separate pin guide body is provided for each pin, in which pin guide body the pin is guided and held for longitudinal movement, and wherein the pin guides body is detachably mounted on the wafer support member.

2. The wafer lifting device as claimed in claim 1, wherein the pin guide body has a guide hole in which the pin is arranged in movable fashion, and the pin guide body is arranged to hold the pin in said second lower position when the lifting platform is lowered.

3. The wafer lifting device as claimed in claim 1 wherein the pin is mounted with spring-loading in the direction of said second lower position.

4. The wafer lifting device as claimed in claim 1 wherein the pin guide body is integrated with the wafer support member and the through hole forms a guide hole for said pin.

5. The wafer lifting device as claimed in claim 1 wherein the pin guide body has a cylindrical body in which a guide hole is formed, and wherein said cylindrical body is mounted to the wafer support member.

6. The wafer lifting device as claimed in claim 5, wherein the cylindrical body is received in a mounting hole in the wafer support member, said mounting hole being coaxial with respect to the guide hole.

7. The wafer lifting device as claimed in claim 6, wherein the cylindrical body has a height corresponding to the thickness of the wafer support member and the mounting hole is a through hole having a diameter which is equal to or slightly greater than the diameter of the cylindrical body.

8. The wafer lifting device as claimed in claim 6 wherein the mounting hole has an internal thread and the cylindrical body has an external thread and is arranged to be engaged by a tool and wherein the cylindrical body is screwed into the mounting hole.

9. The wafer lifting device as claimed in claim 5 wherein the cylindrical body, is provided with a flange at a side perpendicular to an axis of the guide hole, wherein said flange has mounting holes for receiving screws for connection to the wafer support member.

10. The wafer lifting device as claimed in claim 9, wherein the wafer support member is provided with threaded holes corresponding to said mounting holes.

11. The wafer lifting device as claimed in claim 9, wherein threaded bolts are mounted on the wafer support member and received through the mounting holes.

12. The wafer lifting device as claimed in claim 5 wherein an enlarged bore having an upper and a lower end and having a larger cross section than the guide hole is arranged in the cylindrical body, said enlarged bore being coaxial with respect to the guide hole, wherein the pin has an attachment, which is smaller than the cross section of the enlarged bore and can be moved longitudinally therein together with the pin, and wherein the lower end of the enlarged bore is formed by a cover attached to the flange plate, said cover having a pin hole, which has a smaller cross section than the enlarged bore and through which the pin penetrates.

13. The wafer lifting device as claimed in claim 12, wherein the attachment is designed as a ring surrounding the pin.

14. The wafer lifting device as claimed in claim 12, wherein a helical spring surrounds the pin in the enlarged bore, said helical spring being retained between the upper end of the enlarged bore and the attachment.

15. The wafer lifting device as claimed in claim 14, wherein the helical spring is composed of a material having a spring durability of greater than 250° C.

16. The wafer lifting device as claimed in claim 15, wherein the material has a spring durability of up to 800° C.

17. A wafer lifting device comprising:
    a wafer support member;
    a lifting platform arranged under said wafer support member; and at least three pins; and
at least a pin guide body,
wherein the top side of said wafer support member includes a wafer bearing area, wherein said lifting platform is arranged to move vertically toward and away from the underside of the wafer support member, and wherein said at least three pins are arranged to be moved through vertical-through holes, which extend from the underside of the wafer support member to the wafer bearing area, by said lifting platform in direct engagement to the pins, said pins being moveable between a first upper position wherein said pins project from the wafer bearing area by a selected amount and a second lower position wherein said pins are refracted into said through holes, wherein a separate pin guide body is provided for each pin, in which pin guide body the pin is guided and held for longitudinal movement, wherein the pin guides body is detachably connected to the wafer support member, wherein the pin guide has a guide hole in which the pin is arranged in movable fashion, and wherein the pin guide is arranged to bold the pin in said second lower position when the lifting platform is lowered.

* * * * *